July 25, 1967 S. R. HOFSTEIN 3,333,168
UNIPOLAR TRANSISTOR HAVING PLURALITY OF INSULATED GATE-ELECTRODES ON SAME SIDE
Original Filed Dec. 17, 1962
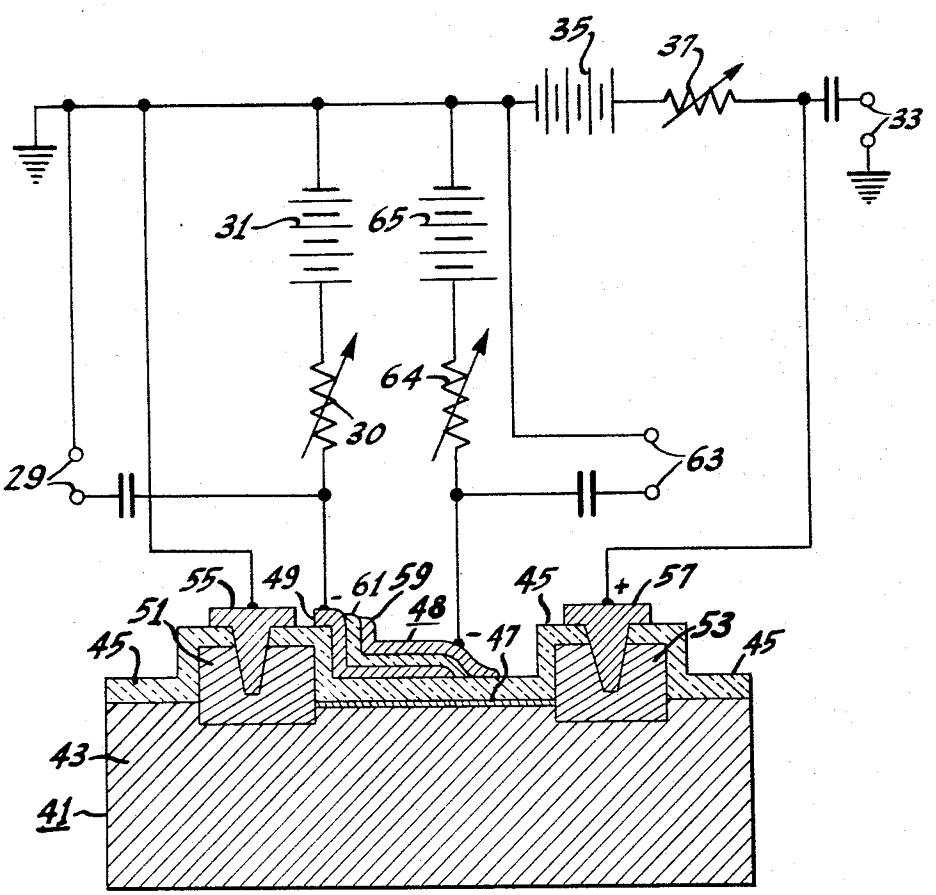
Inventor:
STEVEN R. HOFSTEIN
BY [signature]
Attorney United States Patent Office 3,333,168 Patented July 25, 1967

3,333,168

UNIPOLAR TRANSISTOR HAVING PLURALITY OF INSULATED GATE-ELECTRODES ON SAME SIDE

Steven R. Hofstein, Princeton, N.J., assignor to Radio Corporation of America, a corporation of Delaware Original application Dec. 17, 1962, Ser. No. 245,086, now Patent No. 3,296,508, dated Jan. 3, 1967. Divided and this application Aug. 17, 1966, Ser. No. 573,123
2 Claims. (Cl. 317—235)

ABSTRACT OF THE DISCLOSURE

An insulated gate field effect transistor has a plurality of gate electrodes, adjacent ones of which overlap each other to provide continuous coverage of the charge carrier path.

This application is a division of my copending application, Ser. No. 245,086, filed Dec. 17, 1962, now Patent No. 3,296,508.

This invention relates to an improved field-effect transistor, which is also referred to as a unipolar transistor. The invention relates particularly to an improved planar-type field-effect transistor of the insulated gate type.

A field-effect transistor comprises generally a channel of low resistivity semiconductor material and two spaced electrical contacts to the channel, which are referred to as the source and the drain. A field-effect transistor includes also a gate electrode adjacent and electrically separated from the channel. When a voltage is applied between the source and the drain, majority charge carriers flow through the channel from the source to the drain. The magnitude of the carrier current may be modulated by modulating the drain-to-source voltage and/or applying a modulating voltage to the gate electrode.

There are several types of field-effect transistors. In a planar-type field-effect transistor, the channel, the source, and the drain are constructed along the surface of a body, usually the surface of a semiconducting or insulating substrate.

It is known that the electrical characteristics, particularly the highest operating frequency, of a planar-type device may be increased by reducing the channel length (distance from source to drain), and reducing the length of the gate (linear dimension of the gate in the direction of the length of the channel). However, it is impractical to manufacture devices having a channel length and a gate length below some minimum dimension which is dependent upon the manufacturing technology. Thus, the manufacturing technology determines the minimum channel length and therefore determines certain of the operating characteristics of the device.

An object of this invention is to provide an improved planar-type field-effect transistor.

Another object is to provide a planar-type field-effect transistor having a minimum channel length as determined by the manufacturing technology and an improved high frequency response.

In general, the planar field-effect transistor of the invention comprises a channel, a source, and a drain constructed along a surface of a semiconductor body as in the prior art.

More than one gate electrode is used in the device of the invention. As referred to herein, all of the gate electrodes are considered together and are referred to as the gate electrode structure. Unlike previous unipolar transistors where more than one gate electrode is used, the gate electrode structure is continuous with respect to a portion of the channel length, so that the resistances in the channel between the source and the gate electrode structure are minimized at the expense of the resistance between the drain and the gate electrode structure.

The gate electrode structure may be offset toward the source and away from the drain so that there is a greater distance between the drain and the gate than there is between the source and the gate. If desired, the gate may overlap the source. As used herein, the source is that electrode from which majority charge carriers flow into the channel.

A more detailed description of the invention and of an illustrative embodiment thereof appears below in conjunction with the drawings, in which the single figure consists of a sectional view of the improved field-effect transistor together with a schematic representation of a typical operating circuit therefor.

A preferred embodiment of the improved field-effect transistor is generally designated by numeral 41 in the drawing. The device 41 comprises a high resistivity base 43 of semiconductor material. The base 43 may be either single crystal or may be polycrystalline; and may be any one of the semiconductor materials used to prepare transistors in the semiconductor art.

The base 43 has a surface adjacent and substantially parallel to which are a high resistivity layer 45 of converted body material and a low resistivity channel 47 between the bulk of the base 43 and the high resistivity layer 45 of converted body material. For purposes of illustration, the base 43 is a single crystal body of P-type silicon having a resistivity of about 100 ohm-cm. and is about 10 mils thick. The high resistivity layer 45 is produced by oxidizing a portion of the surface of the base 43. The high resistivity layer 45 is about 2,000 A. thick and consists essentially of pure silicon oxide produced by completely oxidizing the silicon of the base 43. The low resistivity channel 47 is produced at the same time as the high resistivity layer 45 and is sometimes referred to as an inversion layer. The channel 47 extends under the entire high resistivity layer 45. The channel 47 is believed to have a low resistivity by virtue of the attraction of free charge carriers thereto by opposite charges held within the high resistivity layer 45.

Disposed on the high resistivity layer 45 and extending adjacent to and substantially parallel to the channel 47 in the direction of the section plane of the figure is a gate electrode structure generally indicated by the numeral 48. Gate electrode structure 48 includes a first gate electrode 49 which may be of deposited aluminum. In the illustrated embodiment, gate electrode structure 48 further includes a second gate electrode 59 which is electrically insulated from the electrode 49 by a layer of insulating material 61. As shown, the gate electrode structure 48 is constructed to provide continuous coverage of at least a portion of the conductive channel 47. To this end, the electrode 59 covers one portion of the channel 47 and the electrode 49 covers a different portion of the conductive channel. To insure continuity, the two gate electrodes 49 and 59 overlap each other.

The entire gate electrode structure 48 may be offset toward a source region 51 and away from a drain region 53 if desired, which has the overall effect of reducing capacitance between the gate electrode structure 48 and the drain region 53, thereby reducing the coupling between the input and the output of the device. The reduced input-to-output circuit coupling improves the stability characteristic of analogue circuits in which the device is used. In switching circuits, this reduced coupling improves the speed of response. This is achieved at the expense of a higher capacitance between the source and the gate electrode, which has a relatively minor effect on the operating characteristics of the device, and which may be tuned out by a proper selection of the associated circuit components.

The source region 51 is in the base 43 and connects to one end of the channel 47. Similarly the drain region 53 is in the base 43 and connects to the other end of the channel 47. The length of the channel 47, which is the distance between the source region 51 and the drain region 53, is about five mils. As illustrated, the source region 51 and the drain region 53 are regions of the base 43 into which N-type impurities have been diffused to render them conducting. Any of the structures which make a suitable connection to the channel 47 may be used as the source region 51 and the drain region 53.

A source electrode 55 contacts a part of the source region 51. A drain electrode 57 contacts a part of the drain region 53. The source and drain electrodes 55 and 57 are preferably of a metal, such as aluminum, and may be produced in the same step and of the same material as the gate electrode 49.

The drawing also includes a circuit for using the device as an amplifier. The circuit shown is typical of a common-source connection circuit. The circuit includes a pair of input terminals 29 for applying an input signal to the gate electrode 49. One input terminal is grounded. The other input terminal is connected to the gate electrode 49 and to means for biasing the gate electrode 49 with respect to the source and drain. As shown, the biasing means comprises a variable gate bias resistor 30 and a battery 31 connected at one end to the gate electrode 49 and grounded at the other end. The circuit includes also a pair of output terminals 33 for deriving an output signal from the device 41. One output terminal 33 is connected to the drain electrode 57 and to means for biasing the drain electrode 57 with respect to ground. The drain biasing means may comprise a battery 35 connected at one end to ground and at the other end serially with a variable load resistor 37 to the drain electrode 57 and output terminal 33. The source electrode 55 is grounded and the drain electrode 57 is biased positively with respect to the source electrode 55. A second pair of input terminals 63 are also provided, together with suitable means, variable resistor 64 and battery 65, for biasing the gate electrode 59.

In one mode of operation of the illustrated circuit, the drain voltage V*d* and drain current I*d* are adjusted to the desired values as by adjusting the variable load resistor 37 and the variable gate bias resistors 30 and 64. Signal voltages are then applied to the input terminals 29 and 63. Drain (conventional) current I*d* flows from ground through the voltage source 35, through the load resistor 37, the drain electrode 57, through the drain 53, the channel 47, the source 51, the source electrode 55 to ground. Majority charge carriers flow in the opposite direction in this embodiment. The transistor may be used to translate from a high impedance input to a low impedance output, to amplify the input signal, or both to translate and to amplify.

The transistor illustrated in the drawing may be prepared by the following process. A 100 ohm-cm. P-type silicon wafer about 18 mils thick is chemically polished to a thickness of 10 mils. A uniform layer of phosphorus doped silicon oxide is thermally deposited upon one surface of the wafer by heating for about 10 minutes at 75° C. in an atmosphere of argon which has been bubbled through trimethyl-phosphate and tetraethyl-orthosilicate. The deposited oxide is consolidated by heating for about 5 minutes at 75° C. in an atmosphere of argon which has bubbled through silane. A photoresist pattern is now deposited upon the consolidated oxide and the oxide etched away leaving the doped consolidated oxide over those areas which are to be the source and drain and removing the doped oxide from the region between source and drain. The wafer is now heated at about 900° C. in oxygen to grow a new silicon oxide layer in the region between source and drain and produce an inversion layer under this layer, and to simultaneously produce a diffusion of impurities from the doped consolidated oxide into the wafer. This diffusion forms the highly doped source-drain regions. Then, the wafer is coated with a photoresist and etched to provide access through the oxide layer into the source and drain. Then aluminum metal is evaporated over the entire surface of the wafer. A photoresist is now applied and the aluminum metal is etched away from the surface of the wafer except where the source electrode 55, the drain electrode 57, and the gate electrode 49 are to be located. It is at this step that the shape of the gate electrode 49 is defined. The only change from a prior method is simply to offset the mask which defines the gate electrode 49. The insulating layer 61 and the second gate electrode 59 are then deposited at the desired position. Finally, the wafer is diced and suitable leads connected to the source, drain and gate electrodes.

What is claimed is:

1. A field-effect transistor comprising a body of semiconductor material having a surface, layer of insulating material on said surface, a charge carrier channel in said body adjacent to and extending substantially parallel to said surface, a source connected to one end of said channel, a drain connected to the other end of said channel, a plurality of continuous gate electrodes on said layer of insulating material and having portions adjacent to and extending substantially parallel to said charge carrier channel in a direction from said source to said drain, each of said gate electrodes overlapping an adjacent one of said gate electrodes, and another layer of insulating material separating the overlapping portions of said electrodes.

2. A field-effect transistor comprising a body of semiconductor material having a substantially planar surface, a thin layer of insulating material on said surface, a semiconductor channel in said body and extending entirely adjacent and substantially parallel to said surface, a source region adjacent said surface connected to one end of said channel, a drain region adjacent said surface connected to the other end of said channel, said source and said drain regions defining the ends of a charge carrier path through said channel substantially parallel to said surface, and a single continuous gate electrode structure comprising at least two continuous gate electrodes, one of said gate electrodes overlapping the other of said gate electrodes and being separated from said other gate electrode by a second thin insulating layer, one end of said gate electrode structure being closer physically to said source region than the other end of said gate electrode structure is to said drain region.

References Cited

UNITED STATES PATENTS 3,258,663 6/1966 Weimer ------------ 317—235

FOREIGN PATENTS 1,037,293 9/1953 France.

JAMES D. KALLAM, *Primary Examiner.*